(12) United States Patent
Okada et al.

(10) Patent No.: US 6,441,587 B2
(45) Date of Patent: Aug. 27, 2002

(54) METHOD TO DETERMINE CAPACITY OF A BATTERY

(75) Inventors: Tetsuya Okada; Katsuhiro Suzuki; Toshitake Kurihara, all of Hyogo (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/820,192

(22) Filed: Mar. 29, 2001

(30) Foreign Application Priority Data

Mar. 30, 2000 (JP) ........................................ 2000-094074

(51) Int. Cl.[7] .................................................. H02J 7/00
(52) U.S. Cl. ...................................................... 320/136
(58) Field of Search ................................ 324/426–428, 324/433; 320/132, 148, 136

(56) References Cited

U.S. PATENT DOCUMENTS

| | | | | |
|---|---|---|---|---|
| 5,124,627 A | * | 6/1992 | Okada | 320/136 |
| 5,381,350 A | * | 1/1995 | Florina et al. | 324/427 |
| 5,412,307 A | * | 5/1995 | Yoshimatsu | 320/136 |
| 5,424,722 A | * | 6/1995 | Inada et al. | 324/426 |
| 5,479,084 A | * | 12/1995 | Satsuma et al. | 320/136 |
| 5,595,345 A | * | 1/1997 | Boehm | 324/428 |
| 5,627,452 A | * | 5/1997 | Okada | 320/148 |

* cited by examiner

*Primary Examiner*—Gregory Toatley
*Assistant Examiner*—Pia Tibbits
(74) *Attorney, Agent, or Firm*—Fleshner & Kim, LLP

(57) ABSTRACT

This method to determine capacity of a battery computes capacity in current value and then converts it into capacity in power value, or computes capacity in power value and then converts it into current value. This method to determine capacity of a battery detects either discharge current or charge current or both, and computes capacity of battery in current value, which is then converted into capacity in power value by way of multiplication by the correcting constant which varies in accordance with capacity in current value. This method to determine capacity of a battery detects battery voltage or detects either discharge current or charge current or both of the battery, then computes battery capacity in power value, and converts capacity in power value so computed into capacity in current value by way of multiplication by the correcting constant which varies in accordance with capacity in power value.

25 Claims, 7 Drawing Sheets

METHOD TO DETERMINE CAPACITY OF A BATTERY

This application is based on application Ser. No. 094074 filed in Japan on Mar. 30, 2000, the content of which incorporated hereinto by reference.

BACKGROUND OF THE INVENTION

Data such as the remaining capacity of a battery, which is used as the source for an electronic device such as a computer, is required to be determined in units or value of electric current or/and electric power. The remaining battery capacity in electric current value is determined by subtracting the discharge current amount from the fully charged battery capacity. The remaining battery capacity in electric power value is determined by subtracting the discharge power amount from the fully charged battery capacity. The remaining capacity in electric current value can be calculated from the multiplied value of discharge current. The remaining capacity in electric power value can be computed from the multiplication of the product of multiplication of current value by voltage. The remaining power in a battery should always be computed by multiplication of battery voltage by discharge current, followed by multiplication of the product of multiplication so conducted, as the voltage of a battery constantly changes as battery continues to discharge.

As described above, the related art methods for determining remaining battery capacity have various disadvantages. The related art devices and methods for calculating the remaining capacity of a battery in an electric current value differ from an electric power value. Accordingly, each calculation should be practiced separately by different devices in order to obtain the remaining battery capacity both in current values and in power values. Such calculations require a very complicated system and heavy workload, and result in technical and financial difficulties.

The present invention has been developed in order to overcome the above stated shortcoming. The primary object of this invention is to provide a method that determines capacity of a battery using both electric current and electric power in a very simple way.

The above references are incorporated by reference herein where appropriate for appropriate teachings of additional or alternative details, features and/or technical background.

SUMMARY OF THE INVENTION

An object of the present invention is to provide a method for calculating remaining battery capacity that obviates one or more of the disadvantages of the related art.

Another object is to determine capacity of a battery, according to the present invention by either calculating capacity in an electric current value alone and then converting the result into an electric power value, or calculating capacity in an electric power value alone and then converting the result into an electric current value.

Another object of the present invention is to provide a method that calculates capacity in electric current value and converts a result into capacity in electric power value.

Another object of the present invention is to provide a method that calculates capacity in electric power value and converts a result into capacity in electric current value.

The method of determining battery capacity calls for either detecting the discharging electric current or detecting the recharging current or both, and thus determines battery capacity in terms of electric current value. Capacity in electric current value so determined is multiplied by the correcting constant which varies in accordance with current capacity and thus capacity in electric power value is determined.

In the present method, for example, the remaining capacity of a battery in electric current value is first calculated from the multiplication of discharge current of the battery and then the remaining capacity in power value is calculated by multiplying the remaining capacity in current value so calculated by the correcting constant which varies in accordance with the remaining capacity in current value. In this way the remaining battery capacity is computed as the relative remaining capacity.

According to the method of determining capacity of a battery, capacity of a battery is first computed in electric power value by detecting the battery voltage and multiplication of discharge current or charge current or both. Capacity in electric power value so calculated is converted into capacity in electric current value by way of being multiplied by the correcting constant which varies in accordance with capacity in power value.

In the present method, for example, the remaining capacity of a battery in power value is first calculated from the multiplication of discharge power and then the remaining capacity in current value is computed by multiplying the remaining capacity in power value by the correcting constant which varies in accordance with the remaining capacity in electric power value. In this way the remaining battery capacity is calculated as the relative remaining capacity.

The method of the present invention to determine capacity of a battery is distinctly different from others in a way that it calculates battery capacity in electric current value as well as electric power value in a very simple way. The reason is that by this method capacity is determined by calculating capacity in current value and converting it into power value or calculating capacity in power value and then converting it into capacity in current value. In this method of the present invention capacity in electric power value is calculated by multiplying capacity in electric current value by the correcting constant which varies in accordance with capacity in current value. Or capacity in current value is calculated by multiplying capacity in power value by the correcting constant which varies in accordance with capacity in power value. In this way the method of the present invention assures a simple and inexpensive device for the circuit in order to obtain battery capacity in electric power value as well as in electric current value.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
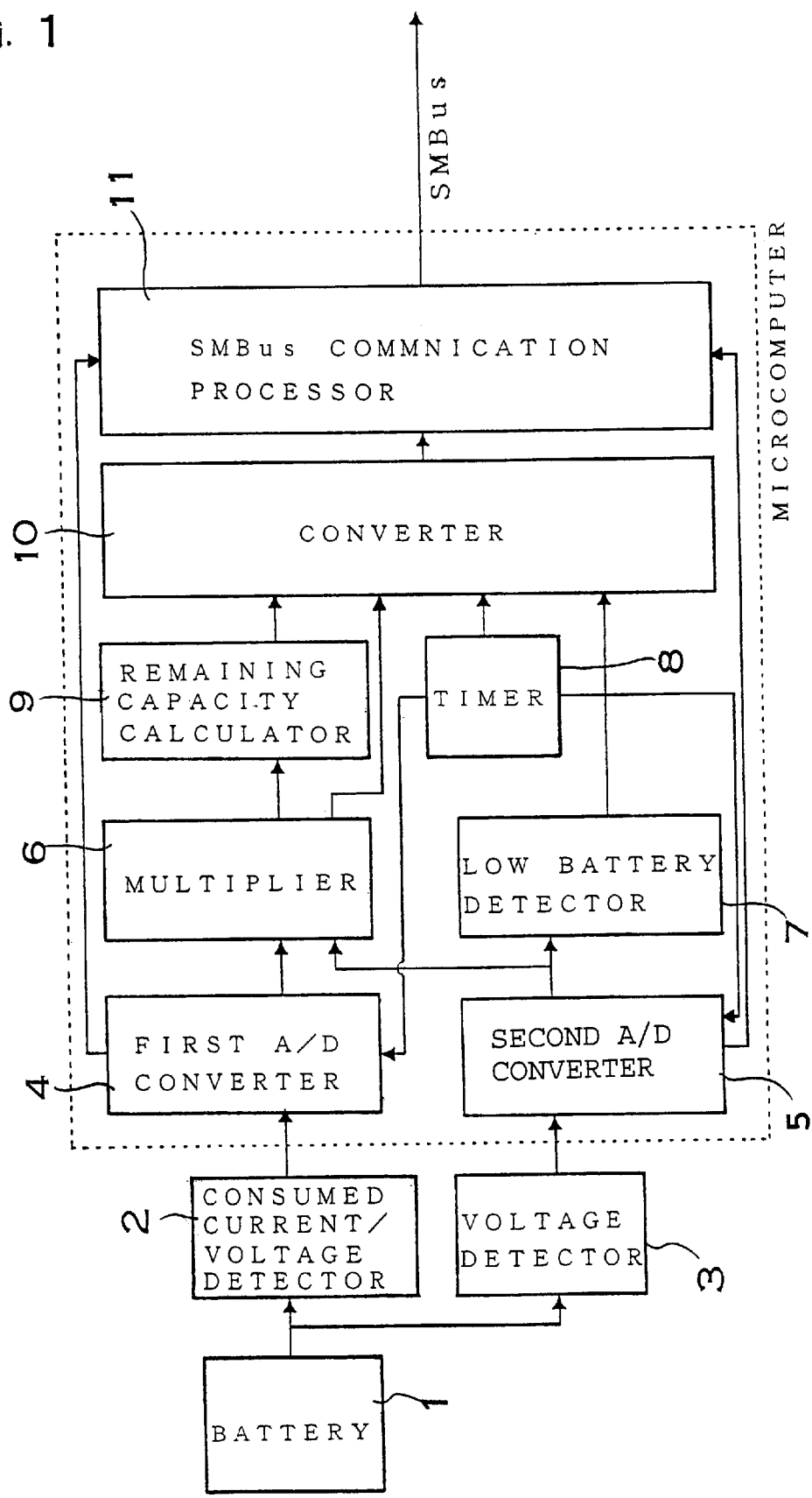
FIG. 1 shows a block diagram of a preferred embodiment of a circuit according to the present invention to determine capacity of a battery.

FIG. 1 shows a block diagram of a preferred embodiment of a circuit that can be stored in a battery pack for the purpose of determining battery capacity according to the present method. A battery pack storing this circuit is preferably attached to an electronic device such as computer or the like, for supplying electric power as well as communicating data such as battery capacity to the electronic device. The electronic device preferably detects the remaining capacity of a battery with information communicated from the battery pack at the prescribed sampling timing.

The battery pack shown in FIG. 1 has a consumed current/voltage detector 2, which detects consumed current of battery 1 and converts the consumed current into a corresponding voltage; a voltage detector 3, which detects voltage of battery 1; and a first A/D converter 4, which converts analogue signals outputted by the consumed current/voltage detector 2 into digital signals. A second A/D converter 5 converts analogue signals outputted at the voltage detector 3 into digital signals. A multiplier 6 multiplies consumed electric power of battery 1 preferably determined from signals outputted by the first A/D converter 4 and by the second A/D converter 5, or multiplies consumed current outputted at the first A/D converter 4. A low battery detector 7 detects voltage at the completion of discharge based on signals outputted at the first A/D converter 4, and a timer 8 operates trigger signals at prescribed intervals to the first A/D converter 4 and the second A/D converter 5 in order to convert analogue signals into digital signals. A remaining capacity calculator 9 preferably computes the remaining capacity by subtracting consumed electric power or consumed electric current from a fully charged battery capacity, and a converter 10 preferably converts value in power into value in current or the other way around, of the remaining battery capacity computed at the remaining capacity calculator 9, or of the multiplication outputted at the multiplier 6. A SMBus data communication processor 11 communicates and outputs the remaining battery capacity to an electronic device such as computer. This battery pack is attached to an electronic device such as computer with SMBus interposed in between.

The consumed current/voltage detector 2 is preferably provided with an electric current resistor with low resisting power connected in series to battery 1 and at the same time provided with a differential amplifier to amplify the voltage generated at the two ends of the resistor. The consumed current/voltage detector 2 outputs current in value flowing to battery 1 as voltage outputted at the differential amplifier. Voltage outputted at the differential amplifier is the product of multiplication of the amount of current flowing to battery 1 by the constant.

Voltage is outputted at consumed current/voltage detector 2 and voltage detector 3 in analogue signals. The first A/D converter 4 and the second A/D converter 5 convert analogue signals into digital signals and output the digital signals in order for digital processing to compute the remaining capacity and make correction. The first A/D converter 4 and the second A/D converter 5 convert received voltage signals and output digital signals upon trigger movement directed by timer 8.

The multiplier 6 multiplies either consumed current or consumed power when battery 1 is discharged; and multiplies either charge current or charge power when battery 1 is charged. The multiplier 6 can preferably be used for multiplying current value, as multiplication of current is performed more easily than multiplication of power. To multiply electric power, multiplication of current value by power value should be performed. For this purpose, the output at the first A/D converter 4 and the second A/D converter 5 should be multiplied. To multiply current value, however, multiplication of the output at the first A/D converter 4 alone serves the purpose, which proves to be a comparatively simple computation. Another possible way is to multiply electric power at the multiplier 6 circuit, is to determine then convert the multiplication in current value into that in power value.

At the remaining capacity calculator 9, the remaining capacity of battery 1 is calculated by subtracting (1) the multiplication of consumed electric current or consumed electric power from (2) the capacity of fully charged battery (i.e., full charge capacity (FCC)) or design capacity, and then the remaining capacity so computed is outputted to the converter 10. FCC, which represents a capacity of fully charged battery 1, is computed from the multiplication of charge current. Not all electric current used for charging battery 1 is expended in charging battery 1, so FCC, which signifies capacity when fully charged, is correctly calculated from multiplying the multiplication of charge current by the charge efficiency factor. There are several ways of indicating the remaining battery capacity; RSOC (Relative State Of Charge) considers the capacity as 100% charged when a battery is fully recharged; ASOC (Absolute State Of Charge) considers the design capacity as 100% charged; or RC (Remaining Capacity) is calculated by the absolute value of Ah (Amp-hours) or Wh (Watt-hours). There are also a couple of ways available to output in relative value; one is a way to calculate in current value and another is one in power value.

At the circuit illustrated in FIG. 1 the remaining capacity of battery 1 is detected. However, the remaining capacity is not always necessary to be detected. There are other performances possible (to determine remaining battery capacity), such as multiplying charge current or multiplying discharge current of battery 1, and calculation by discharged power or its multiplication. As the remaining capacity is determined by subtracting discharge capacity from fully charged capacity, the remaining capacity calculator is indispensable in this circuit. Multiplication of discharge current or charge current, or multiplication of discharge power or charge power can be performed at the multiplier 6, so the calculation signals can be outputted from the multiplier 6 directly to the converter 10.

The low battery detector 7, supplied with the output from the second A/D converter 5, detects whether the voltage of the battery 1 drops below the discharge termination voltage. The low battery detector 7 transmits the discharge termination voltage signal to the converter 10 when the voltage of battery 1 actually drops below the discharge termination voltage.

The converter 10 converts the remaining battery capacity communicated from the remaining capacity calculator 9, from power value into current value or from current value into power value. The remaining capacity in power value is calculated by multiplying the remaining capacity in current value by the correcting constant and the remaining capacity in current value is calculated by multiplying the remaining capacity in power value by the correcting constant. The correcting constants are stored in memory attached to the converter 10. The Table 1 shows the correcting constants stored in memory at the converter 10, which correct the remaining capacity in current value into the remaining capacity in power value.

TABLE 1

| RSOC (mAh) | 100 | 98–81 | 80–61 | 60–41 | 40–21 | 20–11 | 10–1 | 0 |
|---|---|---|---|---|---|---|---|---|
| Correcting Constants | 100 | 99 | 98 | 97 | 96 | 93 | 93 | 100 |

Shown in the table above are the correcting constants which correct the remaining capacity in current value into that in power value. RSOC signifies the relative remaining capacity established when fully charged capacity of a battery is considered as 100% charged. RSOC in currentvalue is converted into RSOC in power value when multiplied by the correcting constant in the table, which is picked out in accordance with RSOC in current value. When RSOC in current value stands at 0 or 100%, the correcting constant is 100% that is 1; when RSOC in current value stands somewhere between 0–100 the correcting constant becomes less than 100%, that is, less than 1. The device that preferably stores the correcting constants for RSOC in current value is a memory attached to the converter 10 for simple conversion of electric current value into electric power value. A table of correcting constants is not necessary when a function for converting, for example, RSOC from current value is inputted in memory at the converter 10. In such a case the function works for converting current value into power value.

The correcting constants that convert current into power are preferably computed by discharging a battery, which is the same type as used in the intended circuit such as in FIG. 1, as a sample, and the computed correcting constants are stored into memory. For example, the correcting constants are computed in the following way.

(1) Fully charged battery 1 is discharged at constant current till the remaining capacity becomes n %. RSOC in current value of battery 1 at this stage is considered to be n %.

(2) Then this battery 1 with no recharging continues its discharge at constant power until the battery 1 completes discharge. In such a case when discharge power is detected as m %, this m % is considered to be RSOC in power value.

(3) The correcting constant at which RSOC in current value stands at n % can be calculated by calculation of m/n outputs.

By setting n % at various points in this manner, correcting constants for converting RSOC at 100–0% in current value into that in power value are computed. The correcting constants thus computed are stored as a table in memory at the converter 10, or the function for correction is stored in memory at the converter. The converter 10 computes RSOC in power value by way of multiplying RSOC in current value by the correcting constant.

While the method stated above states how to convert RSOC in current value into RSOC in power value, there is a way to convert RSOC in power value into current value. In this case the correcting constant for RSOC at m % in power value should be computed by applying n/m as a correcting constant in step (3) stated above. The correcting constants are stored as a table or as the function in memory at the converter 10. The converter 10 converts RSOC in power value into RSOC in current value by way of multiplying RSOC in power value by the stored correcting constant.

How the converter 10 converts RSOC in current value into RSOC in power value is stated above. The same converter can convert ASOC in current value into ASOC in power value, ASOC being the remaining capacity when nominal capacity so-called DC (Design Capacity) is considered as 100%. ASOC is computed from calculation of RSOC, which then is converted into ASOC in the remaining capacity. The difference between RSOC and ASOC lies in the difference of full capacity upon which calculation is based. Therefore, conversion is easily performed by the following equation.

$$ASOC = RSOC \times (FCC/DC)$$

For example, when fully charged capacity FCC drops to 50% of DC, ASOC of battery 1 becomes one half capacity of RSOC. Standard value for correcting ASOC, which is 100%, becomes twice more in the case above.

In the circuit shown in FIG. 1 the output at the remaining capacity calculator 9 is communicated to the converter 10. The remaining capacity of battery 1 is inputted at the converter 10 either in current value or in power value. However, the method of the present invention to determine the capacity of a battery is not restricted to determination of the remaining capacity alone. Capacity of a battery could be the multiplication of discharge current or charge current. The multiplication can be performed either in power value or in current value to determine the remaining battery capacity, which is then converted by way of multiplication by the correcting constant. The correcting constants used in conversion are calculated by detecting electric power and electric current in charging or discharging a sample battery.

Figure 2:
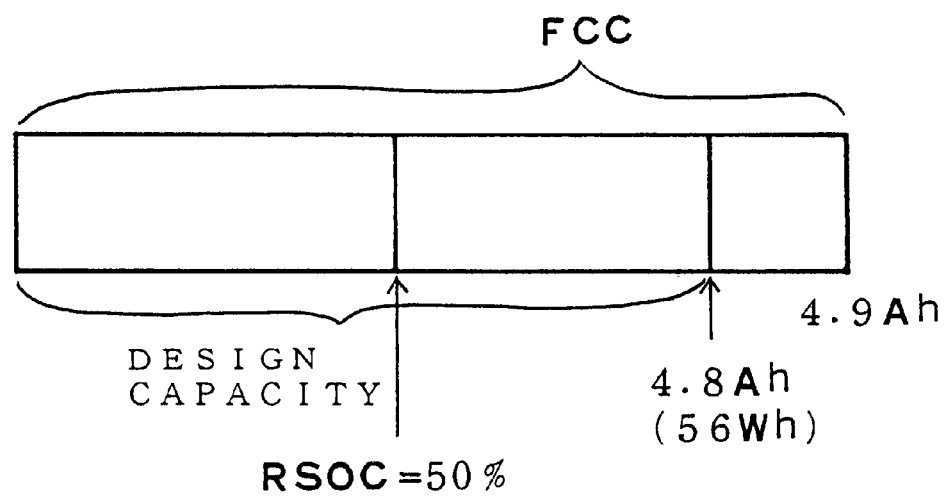
FIG. 2 shows an example of a battery to be used for determining battery capacity.

As illustrated in FIG. 2 a sample battery with measurements including DC of 4.8 Ah and 56 Wh is charged and the multiplication of charge current is shown to be 4.9 Ah. Then, the same battery is discharged and from the multiplication of discharge current the RSOC in current value is calculated to be 50%, and the converter 10 can compute RSOC in power value in the following way. RSOC in power value is calculated by way of multiplying RSOC in current value by the correcting constant. When RSOC in current value stands at 50%, the correcting constant should be 97% as read in the table. Therefore, RSOC in power value is calculated in the following equation.

RSOC (in power value)=(RSOC in current value)×(correcting constant)=50%×0.97=48%

Full charge capacity (Wh) of this battery is calculated as follows. As DC measured In Ah is 4.8 Ah and FCC is 4.9 Ah, FCC should be 4.9/4.8 times as much as DC. So FCC measured in Wh is computed as follows. This computation is performed at the converter 10.

FCC (Wh)=56Wh×4.9/4.8=57.16 Wh

ASOC of this battery is calculated as follows. This equation is also performed at the converter 10.

ASOC (in current value)=RSOC×(FCC/DC)=50%×4.9/4.8=51%

ASOC (in power value) 48%×57.16/56=49%

RC (remaining capacity) of this battery measured in Ah and Wh is calculated as follows.

Figure 3:
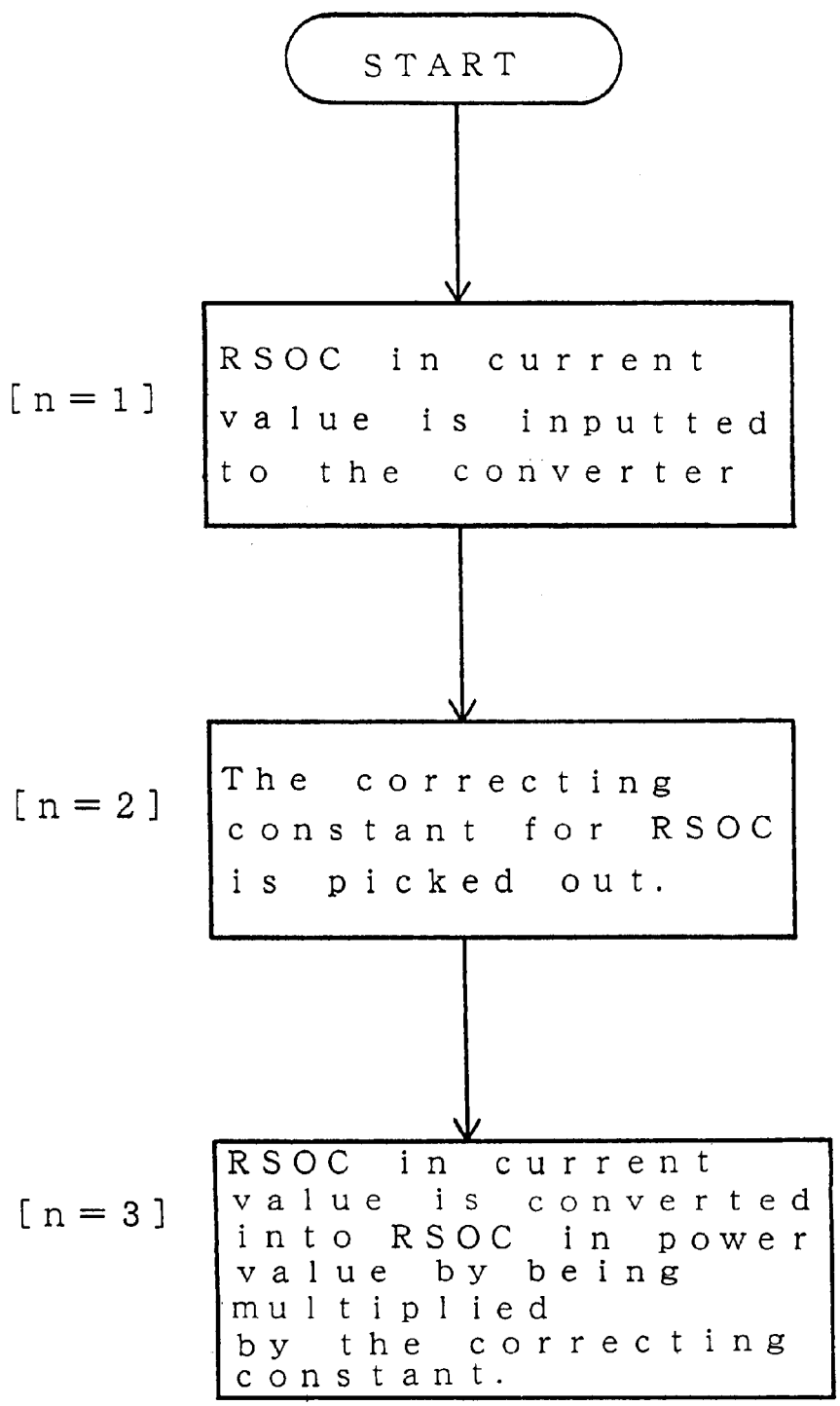
FIG. 3 shows a flow chart to illustrate converting Relative State Of Charge (RSOC) in electric current value into RSOC in electric power value.

RC (In current value)=FCC (in current value)×RSOC (in current value)=4.9 Ah ×50%=2.45 Ah RC (in power value)=FCC (in power value)×RSOC (in power value)=57.16 Wh ×48%=27.43 Wh The circuit illustrated in FIG. 1 can be used to convert RSOC in current value into RSOC in power value following the steps shown in the flow chart below which is illustrated in the FIG. 3.

[In the Step when n=1]

RSOC in current value is inputted from the remaining capacity calculator 9 to the converter 10.

[In the Step when n=2]

The converter 10 picks out the right correcting constant for inputted RSOC. The converter 10 determines from the table stored in memory or from function the correcting constant for RSOC in current value.

[In the Step when n=3]

RSOC in current power is multiplied by the correcting constant to be converted into RSOC in power value.

Figure 4:
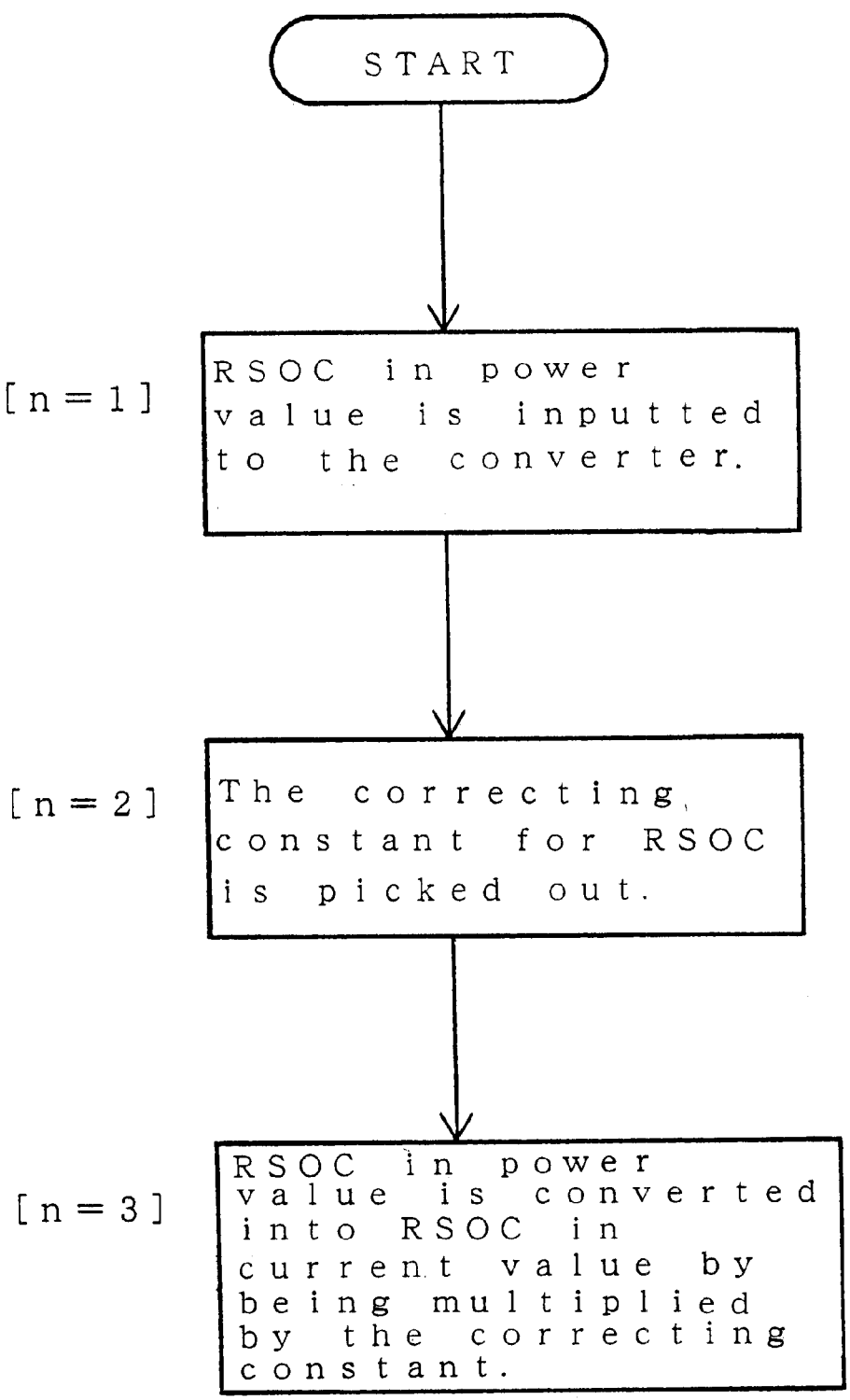
FIG. 4 shows a flow chart to illustrate convertin Relative State Of Charge (RSOC) in electric power value into RSOC in electric current value.

The circuit illustrated in the FIG. 1 converts RSOC in power value into RSOC in current value following the steps shown in the flow chart below which is illustrated in the FIG. 4.

[In the Step when n=1]

RSOC in power value is inputted from the remaining capacity calculator to the converter 10.

[In the Step when n=2]

The converter 10 picks out the correcting constant for inputted RSOC. The converter 10 determines from the table (e.g., Table 1) stored in memory or from function the correcting constant for RSOC in power value.

[In the Step when n=3]

RSOC in power value is multiplied by the correcting constant to be converted into RSOC in current value.

The converter 10 can also convert ASOC in current value into power value or ASOC in power value into current value.

Figure 5:
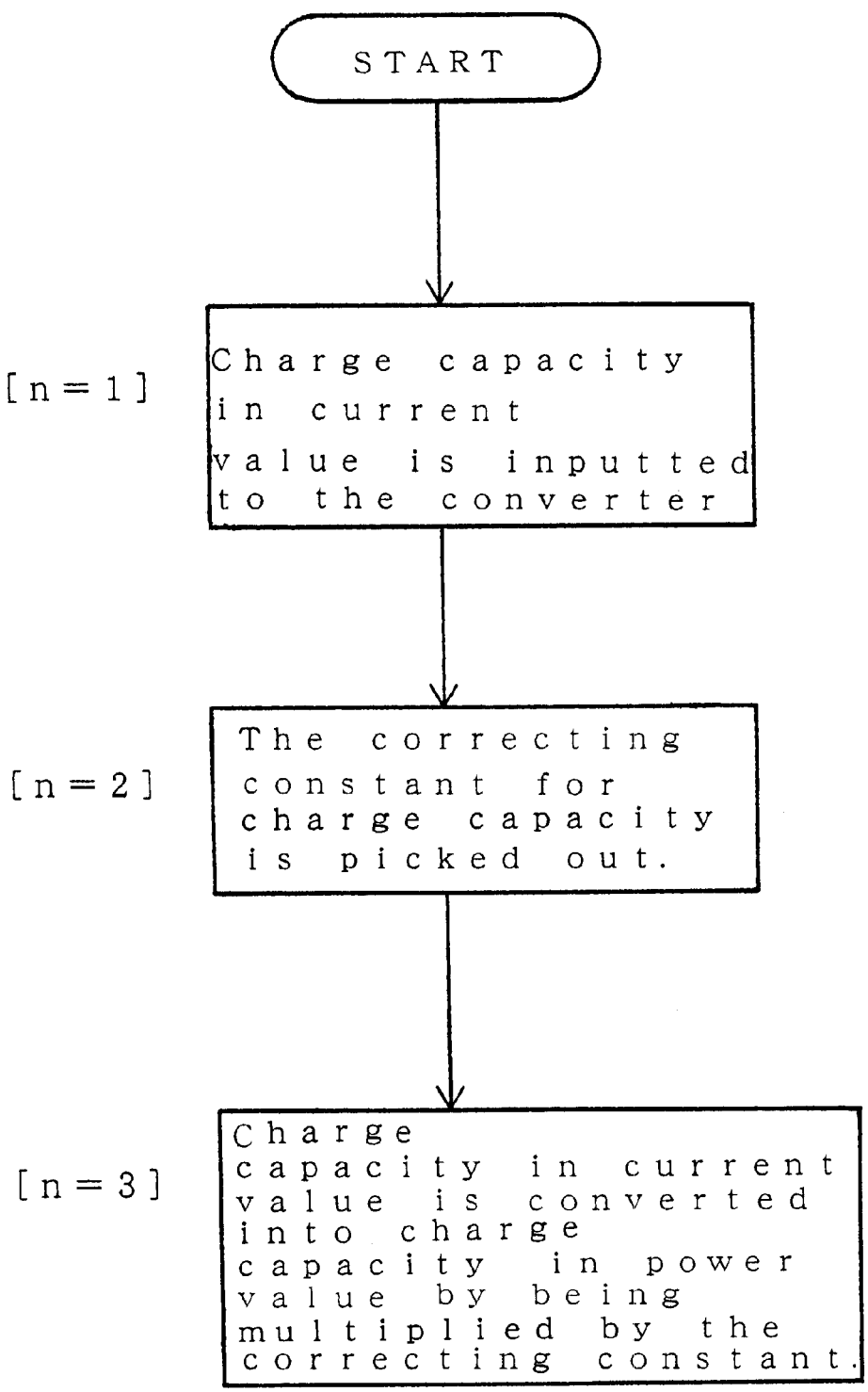
FIG. 5 shows a flow chart to illustrate converting full charge capacity in current value into that in power value.

The circuit illustrated in FIG. 1 converts charge capacity in current value into that in power value following the steps in the flow chart below which is illustrated in the FIG. 5.

[In the Step when n=1]

Charge capacity in current value is inputted to the converter 10 from the multiplier 6.

[In the Step when n=2]

The converter 10 picks out the correcting constant for the charge capacity inputted. The converter 10 determines the correcting constant for the charge capacity in current value from the table or function stored in memory.

[In the Step when n=3]

The charge capacity in current value is multiplied by the correcting constant to be converted into the charge capacity in power value.

Figure 6:
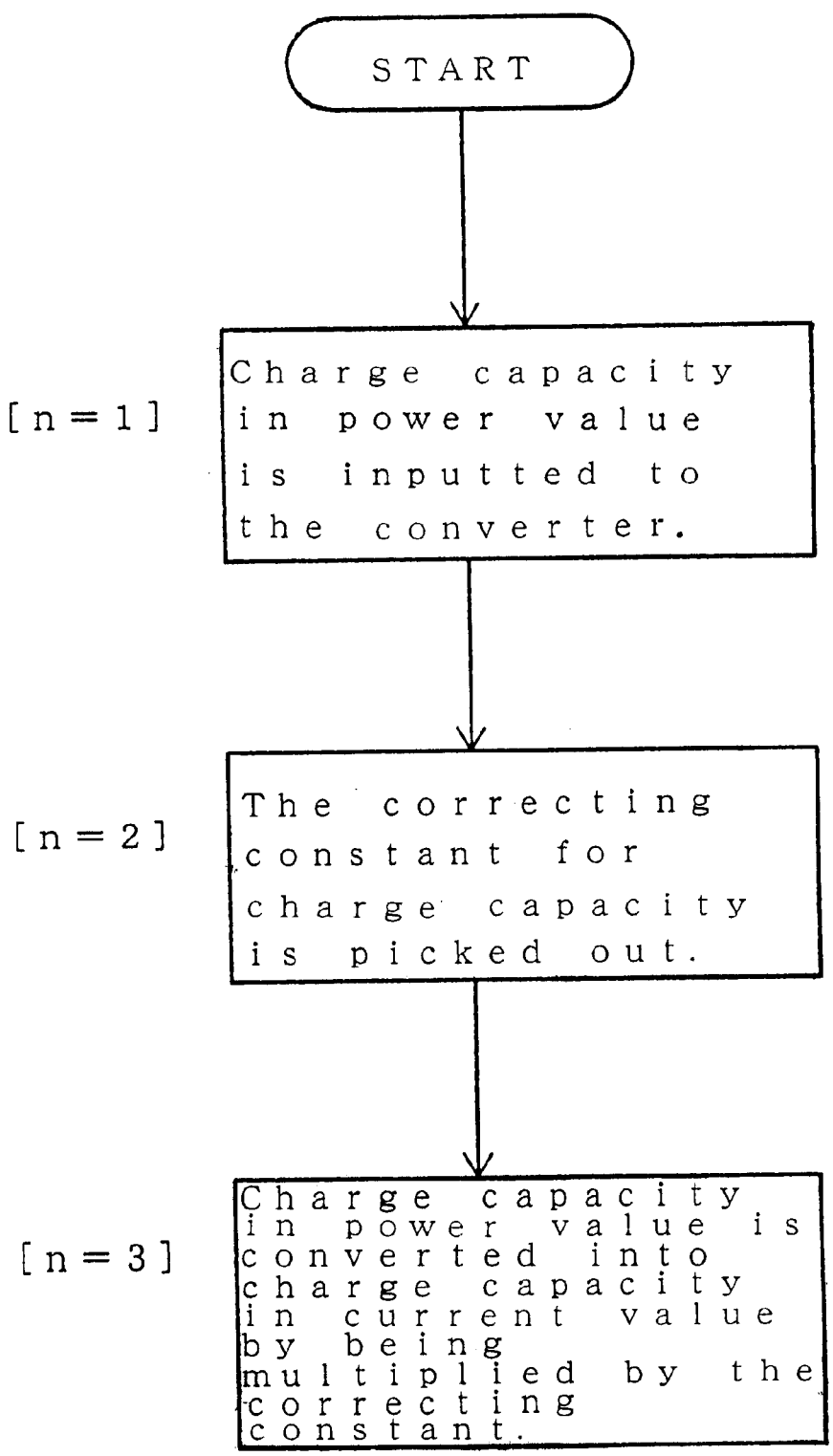
FIG. 6 shows a flow chart to illustrate converting full charge capacity in power value into that in current value.

The circuit illustrated in the FIG. 1 converts the charge capacity in power value into that in current value, following the steps in the flow chart below which is illustrated in the FIG. 6.

[In the Step when n=1]

The charge capacity in power value is inputted to the converter 10 from the multiplier 6.

[In the Step when n=2]

The converter 10 picks out the correcting constant for the charge capacity inputted. The converter picks out the correcting constant for the charge capacity in power value from the table or function stored in memory.

[In the Step when n=3]

The charge capacity in power value is multiplied by the correcting constant to be converted into the charge capacity in current value.

In the similar steps as stated above the discharge capacity of a battery in current value can be converted into the discharge capacity in power value.

Figure 7:
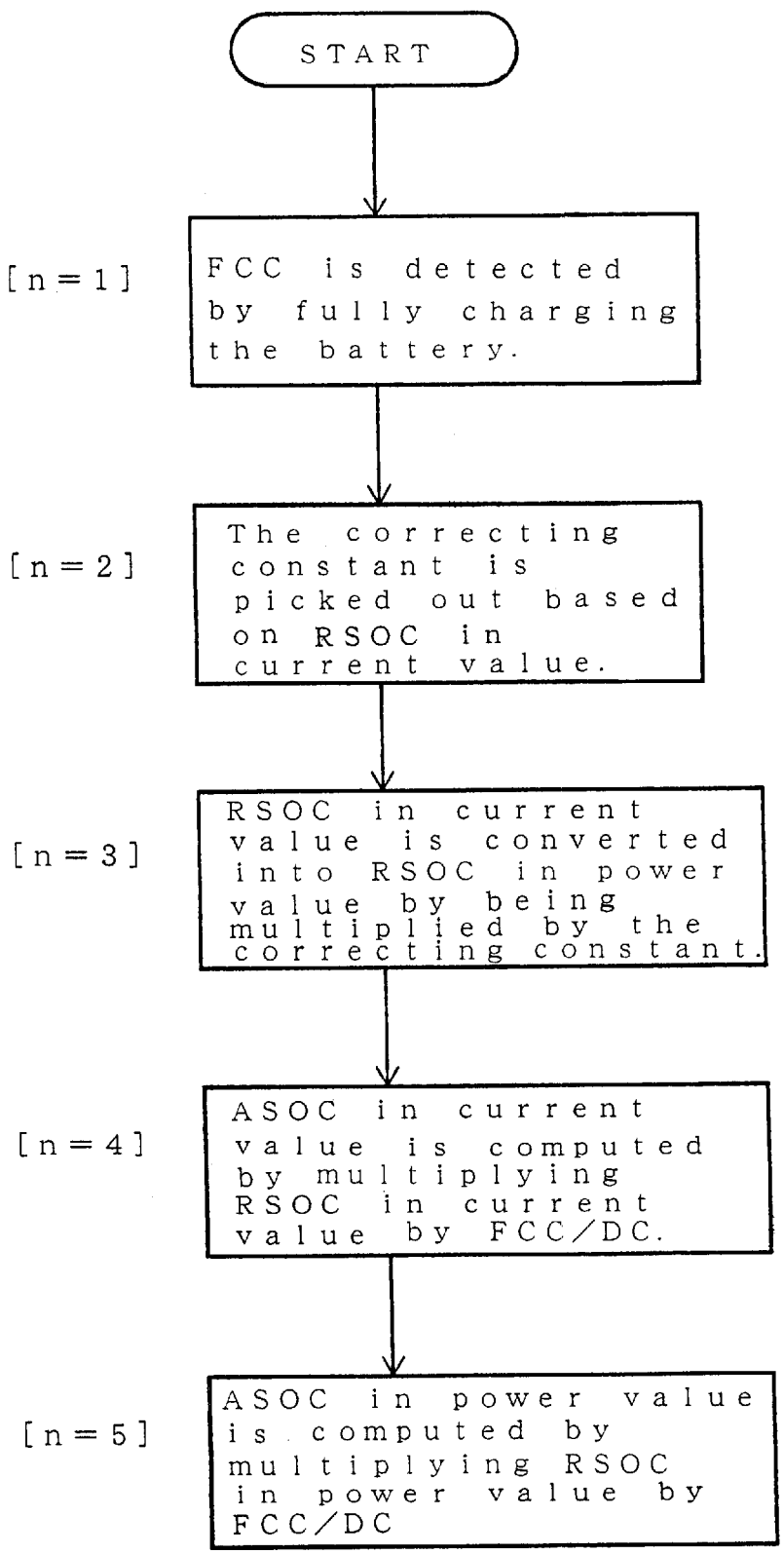
FIG. 7 shows a flow chart to illustrate computing Absolute State Of Charge (ASOC) in both current value and power value from Relative State Of Charge (RSOC) in current value.

The circuit illustrated in the FIG. 1 can also compute ASOC in current or in power value from RSOC in current value following the steps in the flow chart below which is illustrated in FIG. 7.

[n the Step when n=1]

FCC is detected from the multiplication of charge current measured when battery 1 is fully charged. FCC is computed by multiplying the multiplication of charge current by the charge efficiency figure.

[In the Step when n=2]

The correcting constant is picked out based on RSOC in current value.

[In the Step when n=3]

RSOC in current value is multiplied by the correcting constant to compute RSOC in power value.

[In the Step when n=4]

RSOC in current value is multiplied by FCC/DC to compute ASOC in current value.

[In the Step when n=5]

RSOC in power value is multiplied by FCC/DC to compute ASOC in power value.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within meets and bounds of the claims, or equivalence of such meets and bounds thereof are therefore intended to be embraced by the claims.

What is claimed is:

1. A method to determine capacity of a battery, comprising:
    (1) detecting at least one of discharge current value and charge current value of the battery from a prescribed capacity state of the battery;
    (2) computing remaining battery capacity in current value, being units of quantity of electricity, based on the detected current value; and
    (3) computing remaining battery capacity in power value, being units of electrical energy, by converting the computed remaining battery capacity in current value using a selected one of a plurality of correcting constants that vary in accordance with the computed remaining battery capacity in current value.

2. A method to determine capacity of a battery according to claim 1, wherein the remaining battery capacity in current value is computed based on the detected discharge current and then the remaining capacity in power value is computed by multiplying the remaining battery capacity in current value by the selected correcting constant.

3. A method to determine capacity of a battery according to claim 2, wherein the remaining battery capacity is relative remaining battery capacity.

4. A method to determine capacity of a rechargeable battery according to claim 3, wherein the (3) computing step further comprises determining the plurality of correcting constants comprising:
    (1) discharging a fully charged battery at a constant current till the remaining battery capacity relative state of charge (RSOC) measures n % of a fully charged battery capacity, at which the relative remaining capacity of the battery in current value is n %;
    (2) detecting m % of discharge power by complete discharging the battery at the n % RSOC in current value using a constant power without recharging, wherein the detected m % is a corresponding relative remaining battery capacity RSOC in power value; and (3) calculating m/n as the selected correcting constant at n % remaining battery capacity RSOC in current value.

5. A method to determine capacity of a battery according to claim 1, wherein current flowing to and from the battery is detected by a consumed current/voltage detector which is electrically connected to the battery.

6. A method to determine capacity of a battery according to claim 5, wherein output voltage of the consumed current/voltage detector is A/D converted into digital single and then the remaining battery capacity in current value is computed and corrected by using the digital signals.

7. A method to determine capacity of a battery according to claim 1, wherein the remaining battery capacity is computed by reducing either a FCC (Full Charge Capacity), which signifies a fully charged battery capacity, or a design capacity of the battery by a consumed current.

8. A method to determine capacity of a battery according to claim 1, wherein the detected current value is based on one of a fully charged capacity and a design capacity of the battery, and wherein the units of quantity of electricity are amp-hour and the units of electrical energy are watt-hour.

9. A method to determine capacity of a battery comprising:
   (1) detecting battery voltage and at least one of discharge current and charge current of a battery;
   (2) computing remaining battery capacity in power value (units of electrical energy);
   (3) computing remaining battery capacity in current value (units of quantity of electricity) by multiplying the computed remaining battery capacity in power value by a correcting constant that varies in accordance with remaining battery capacity in power value.

10. A method to determine capacity of a battery according to claim 9, wherein the remaining capacity in power value is calculated from a detected discharge power.

11. A method to determine capacity of a battery according to claim 10, wherein the computed remaining battery capacity is relative state of charge remaining capacity.

12. A method to determine capacity of a battery according to claim 10, wherein the relative remaining battery capacity is computed by subtracting consumed power either from a fully charged battery capacity (FCC), or from design capacity.

13. A method to determine capacity of a battery according to claims 9 wherein current flowing to or from the battery is detected by a consumed current/voltage detector that is electrically connected to the battery.

14. A method to determine capacity of a battery according to claim 13 wherein output voltage of the voltage detector and the consumed current/voltage detector is A/D converted into digital signals and then the remaining battery capacity is computed and corrected by using the digital signals.

15. A method to determine capacity of a rechargeable battery according to claim 9, further comprising determining the correcting constant, wherein determining the correcting constant comprises:
   (1) discharging a fully charged battery at a constant current till the remaining battery capacity relative state of charge (RSOC) measures n %, at which the relative remaining capacity of the battery in current value is n %;
   (2) detecting m % of discharge power by complete discharging the battery at the n % RSOC in current value using a constant power without recharging, wherein the detected m % is a corresponding relative remaining battery capacity RSOC in power value; and
   (3) calculating n/m as the correcting constant at n % remaining battery capacity RSOC in power value.

16. A method to determine capacity of a battery according to claim 9, wherein the detected current value is based on one of a fully charged capacity and a design capacity of the battery, and wherein the units of quantity of electricity are amp-hour and the units of electrical energy are watt-hour.

17. A method to determine capacity of a battery pack, comprising:
   (1) detecting consumed current of the battery and converting the detected consumed current into corresponding voltage at a consumed current/voltage detector;
   (2) detecting voltage of battery at a voltage detector;
   (3) converting analogue signals outputted by the consumed current/voltage detector into digital signals at a first A/D converter;
   (4) converting analogue signals outputted by the voltage detector into digital signals at a second A/D converter;
   (5) determining either consumed electric power of the battery, which is based on the digital signals of the first A/D converter, and the second A/D converter or consumed current based on the digital signals output by the first A/D converter using a multiplier;
   (6) detecting a discharge termination voltage based on the digital signals outputted at the second A/D converter by using a low battery detector;
   (7) generating trigger signals for converting the analogue signals into the digital signals for transmission to the first A/D converter and the second A/D converter at prescribed intervals by using a timer;
   (8) computing remaining battery capacity by subtracting either the consumed current or the consumed electric power from fully charged capacity by using a remaining capacity calculator;
   (9) converting either the remaining battery capacity computed at the remaining capacity calculator or a multiplication result signal outputted at the multiplier from current value into power value, or power value into current value, by using a converter; and
   (10) transmitting the remaining capacity to an electronic device.

18. A method to determine capacity of a battery pack cited in claim 17, wherein the battery pack is connected to the electronic device via a data bus.

19. A method to determine capacity of a battery pack cited in claim 17, wherein the consumed current/voltage detector outputs electric current of the battery as output voltage from a differential amplifier.

20. A method to determine capacity of a battery pack according to claim 17, wherein converting the remaining battery capacity in current value into power value comprises:
   (1) inputting a relative remaining capacity in current value from the remaining capacity calculator into the converter;
   (2) determining a correcting constant for the relative remaining capacity in current value inputted at the converter; and
   (3) converting into the relative remaining capacity in power value by multiplying the relative remaining capacity in current value by the correcting constant.

21. A method to determine capacity of a battery according to claim 17, wherein converting the remaining battery capacity in power value into the remaining battery capacity in current value comprises:

(1) communicating the remaining battery capacity in power value to the converter from the remaining capacity calculator;

(2) selecting at the converter, the correcting constant for a relative remaining battery capacity so communicated; and (3) multiplying the relative remaining battery capacity in power value by the correcting constant to convert the relative remaining battery capacity in power value into the relative remaining battery capacity in current value.

22. A method to determine capacity of a battery, comprising:

detecting remaining battery capacity of the battery in one of units of quantity of electricity and units of electrical energy;

determining one of a plurality of correcting constants corresponding to the detected remaining battery capacity; and converting the detected remaining battery capacity from said one of units of quantity of electricity and units of electrical energy to the other of said units of quantity of electricity and units of electrical energy by multiplying the detected remaining battery capacity by the determined one of the plurality of correcting constants or its reciprocal.

23. A method to determine capacity of a battery according to claim 22, wherein the converted remaining battery capacity is an absolute state of charge (ASOC) remaining battery capacity calculated using a detected full charge capacity (FCC) and a design capacity (DC) of the battery.

24. A method to determine capacity of a battery according to claim 22, wherein the converted remaining battery capacity is a relative state of charge (RSOC) remaining battery capacity calculated using a detected full charge capacity (FCC).

25. A method to determine capacity of a battery according to claim 22, wherein the determining step comprises:

(1) discharging a fully charged battery at a constant current till a remaining battery capacity relative state of charge (RSOC) measures n %, at which the relative remaining capacity of the battery in current value is n %;

(2) detecting m % of discharge power by complete discharging the battery at the n % RSOC in current value using a constant power without recharging, wherein the detected m % is a corresponding relative remaining battery capacity RSOC in power value; and (3) calculating m/n as the correcting constant at n % remaining battery capacity RSOC in current value.

* * * * *